(12) United States Patent
Stevenson

(10) Patent No.: US 6,209,112 B1
(45) Date of Patent: Mar. 27, 2001

(54) APPARATUS AND METHOD FOR REDUCING POWER CONSUMPTION OF AN ERROR-CORRECTING DECODER

(75) Inventor: Carl R. Stevenson, Macungie, PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/126,555

(22) Filed: Jul. 31, 1998

(51) Int. Cl.$^7$ .................................................. H03M 13/00
(52) U.S. Cl. ............................................................. 714/752
(58) Field of Search ...................................... 714/752, 758, 714/776, 774, 756, 783, 787

(56) References Cited

U.S. PATENT DOCUMENTS

| | | | |
|---|---|---|---|
| 5,058,110 | * 10/1991 | Beach et al. | 370/85.6 |
| 5,537,428 | * 7/1996 | Larsson et al. | 714/758 |
| 5,721,743 | * 2/1998 | Sharpe et al. | 714/752 |
| 5,852,664 | * 12/1998 | Iverson et al. | 705/51 |
| 6,035,425 | * 3/2000 | Caldwell et al. | 714/52 |
| 6,052,812 | * 4/2000 | Chen et al. | 714/751 |

* cited by examiner

*Primary Examiner*—Albert Decady
*Assistant Examiner*—Shelly A Chase
(74) *Attorney, Agent, or Firm*—Ian M. Hughes; Steve Mendelsohn

(57) ABSTRACT

An error-correction process enables or disables error-correction in a cellular or wireless unit so as to conserve power of a battery or other power storage unit of the cellular or wireless unit. The error-correction process includes receiving a datablock having a checksum value and an encoded payload, the encoded payload includes one or more parity bits for error-correction of bit values within the encoded payload. If the checksum value is equivalent to a checksum value calculated for the encoded payload, then the error-correction process removes the parity bits from the encoded payload and provides the remaining encoded payload bits as the error-corrected data. Otherwise, if the checksum and calculated checksum are not equivalent, error-correction of the encoded payload is enabled.

14 Claims, 4 Drawing Sheets

APPARATUS AND METHOD FOR REDUCING POWER CONSUMPTION OF AN ERROR-CORRECTING DECODER

BACKGROUND OF THE INVENTION

1. Field of the Invention

The present invention relates to error-correction decoding, and, more particularly, to control of error-correction processing.

2. Description of the Related Art

Many telecommunication applications require transmission of signals between centralized stations handling traffic from a network and remote units providing a communication link for a user to the centralized station. Further, remote units may not necessarily have access to continuous, external power supplies. For example, the remote unit may often be entirely powered by a battery, which must be charged from time to time, or may have a battery as a back-up power source in the event that a main power source is disrupted. Remote units may be, for example, portable personal computers, hand-held radio devices, handheld phones or wireless sets. In addition, new telemetry applications, such as home security monitoring, may have battery power for remote units such as sensors.

Conservation of battery power in battery-powered wireless applications, in particular, is of growing importance. First, such units tend to be small and lightweight, requiring a battery having small physical size. Such batteries tend to also store and make available limited power as a consequence of small size. As is known, the time between recharging these batteries is dependent upon power consumed by the unit. Power consumed, in-turn, is dependent upon an amount of processing performed by the unit, such as call processing, paging and broadcast channel monitoring and memory administration. Typically, units are maintained in an inactive mode until a request to initiate a communication link is made. However, even in an inactive mode, units are often still monitoring common channels of the wireless network, which requires some processing and, hence, power consumption.

One type of processing performed is error-correction encoding in a transmit path and error-correction decoding in a receive path. Error-correction encoding typically requires minimal processing steps, and so error-correction encoding is usually enabled in a transmitter since little power is required. Error-correction decoding, however, is typically computationally intense, requiring substantial power.

SUMMARY OF THE INVENTION

The present invention relates to an apparatus and method of error-correcting data of a datablock. Error-correction in accordance with the present invention includes receiving the datablock comprising a first checksum value and encoded payload, the encoded payload having at least one parity value; calculating a second checksum value for the encoded payload; and comparing the first checksum value with the second checksum value. If the first checksum value is equivalent to the second checksum value, then each parity value is removed from the encoded payload, and the remaining values of the encoded payload are provided as an error-corrected data. Otherwise, error-correction of the encoded payload is enabled in accordance with each parity value to provide the error-corrected data, thereby to conserve a power consumed by the error-correction decoder.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

In accordance with the present invention, a processing section of a wireless unit monitors whether information received in a datastream from a communication link requires error-correction decoding as part of the decoding process. If error-correction decoding is required, then the error-correction circuitry or process is enabled and the information is provided to the error-correction circuitry or process. If no error-correction is required, then pre-processing circuitry disables the error-correction circuitry or process and removes error-correction information in the received data, and then provides the information directly. Enabling error-correction only when required conserves power of, for example, a battery of the wireless unit.

A datablock is received comprising a first checksum value and an encoded payload, the encoded payload having at least one parity value and the data. A second checksum value is calculated for the encoded payload, and then the first checksum value and the second checksum value are compared. If the first checksum value is equivalent to the second checksum value, then the at least one parity bit value is removed and the encoded payload is provided as the error-corrected data. If, however, the first checksum value is not equivalent to the second checksum value, then error-correction processing of the encoded payload is enabled based on the at least one parity bit value to provide the error-corrected data.

For the following, a preferred embodiment of the present invention is described with reference to a wireless communication system. However, as would be apparent to one skilled in the art, the present invention may be employed in any system having error-correction, wired or wireless, in which conservation of power of a battery, for example, is desired. Such other systems may be, for example, remote telemetry systems or security systems with remote, battery-powered units or sensors.

Figure 1:
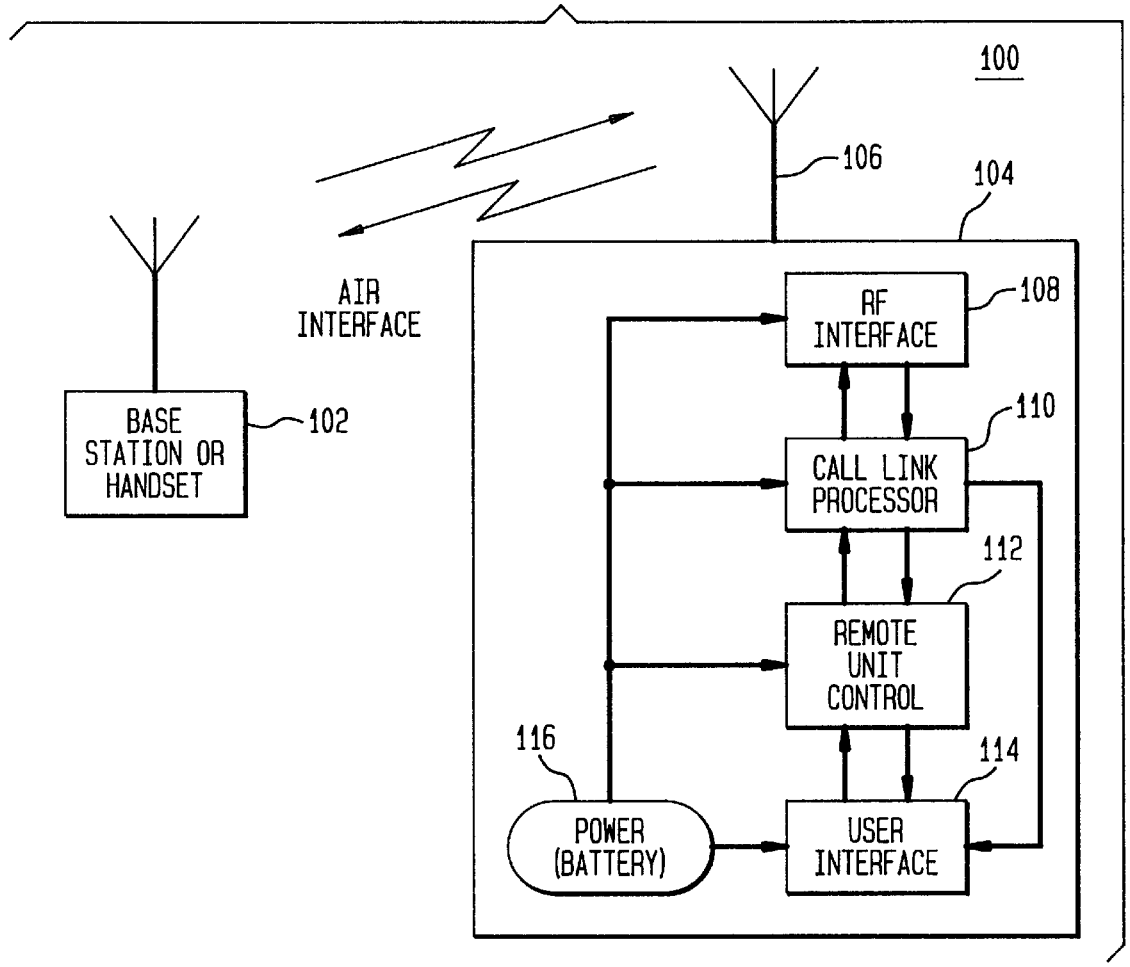
FIG. 1 shows a wireless communication system employing an error-correction system in accordance with the present invention.

Referring to FIG. 1, there is shown a wireless communication system 100 that may employ an error-correction system in accordance with the present invention. The wireless system 100 includes a base station 102 and a wireless handset 104. For convenience, the wireless handset unit 104 is herein referred to as a "handset". Each handset 104 may comprise an antenna 106, a Radio Frequency (RF) interface 108, call link processor 110, remote unit controller 112, power unit 116 and a user interface 114. The error-correction system in accordance with the present invention may be employed in either base station 102 and/or handset 104. The present invention is not limited to a combination of a base station 102 and handset 104, but may be employed between any wireless units. For example, the present invention may be employed between base stations or between handset units communicating through any communication channel having error-correction encoding and decoding. Consequently, although the following description of the error-correction system is as employed by handset 104, as would be apparent to one skilled in the art, the following may also be employed by base station 102.

Handset unit 104 of FIG. 1 receives from an air interface a communication signal having a carrier modulated by one or more datablocks. The communication signal is received via antenna 106, and RF interface 108 demodulates the one or more datablocks from the carrier in the communication signal to provide a datastream to call link processor 110. Call link processor 110, in turn, processes the datastream provided by RF interface 108 to provide a sequence of datablocks. These datablocks are then processed into data provided to user interface 114. Call link processor 110 also may provide error-correction or error-detection processing of the datablocks received from RF interface 108. Processing of the datablocks or data stream by call link processor 110 is typically controlled by remote unit controller 112. As shown in FIG. 1, the various processing units of the handset 104 are each powered by a power supply 116, which may be a battery or other power storage unit.

Figure 2:
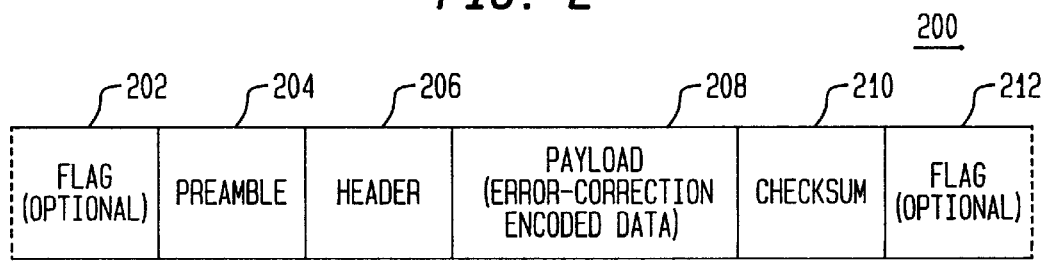
FIG. 2 shows a formatted datablock having a packet format and error-correction information as employed with an error-correction system in accordance with the present invention.

FIG. 2 illustrates a packet as one exemplary embodiment of a datablock received or transmitted by the handset unit 104 of FIG. 1. Packet 200 may be formatted so as to have an optional flag 202, preamble 204, header 206, payload 208, checksum value 210 and an optional end flag 212. A position of packet 200 within a datastream may normally be identified by the optional beginning flag 202 and end flag 212. Once packet 200 is received, the preamble 204 is examined to recover timing and other information related to receiving subsequent bits contained in the header 206, payload 208, and checksum 210. Once timing from preamble 204 is determined, header 206 is examined to determine if the packet 200 should be processed. If the packet 200 is to be processed, then payload 208, which may comprise one or more datawords, is extracted. Once the payload 208 is extracted, a checksum calculation is made to determine whether or not the calculated checksum value of the payload 208 is equivalent to the received checksum value 210 included in packet 200. Checksum value 210 of packet 200 is compared with the calculated checksum value of payload 208 to determine if they are equivalent. An error in the packet 200 may be detected if the checksum value 210 is not equivalent to the calculated checksum value of payload 208. FIG. 2 illustrates a packet format for a datablock; however, as is known in the art, other formats may be employed. For example, a format that may also be used comprises a datastream having periodic framing bits and error-correction information periodically inserted into a continuous data stream.

Figure 3:
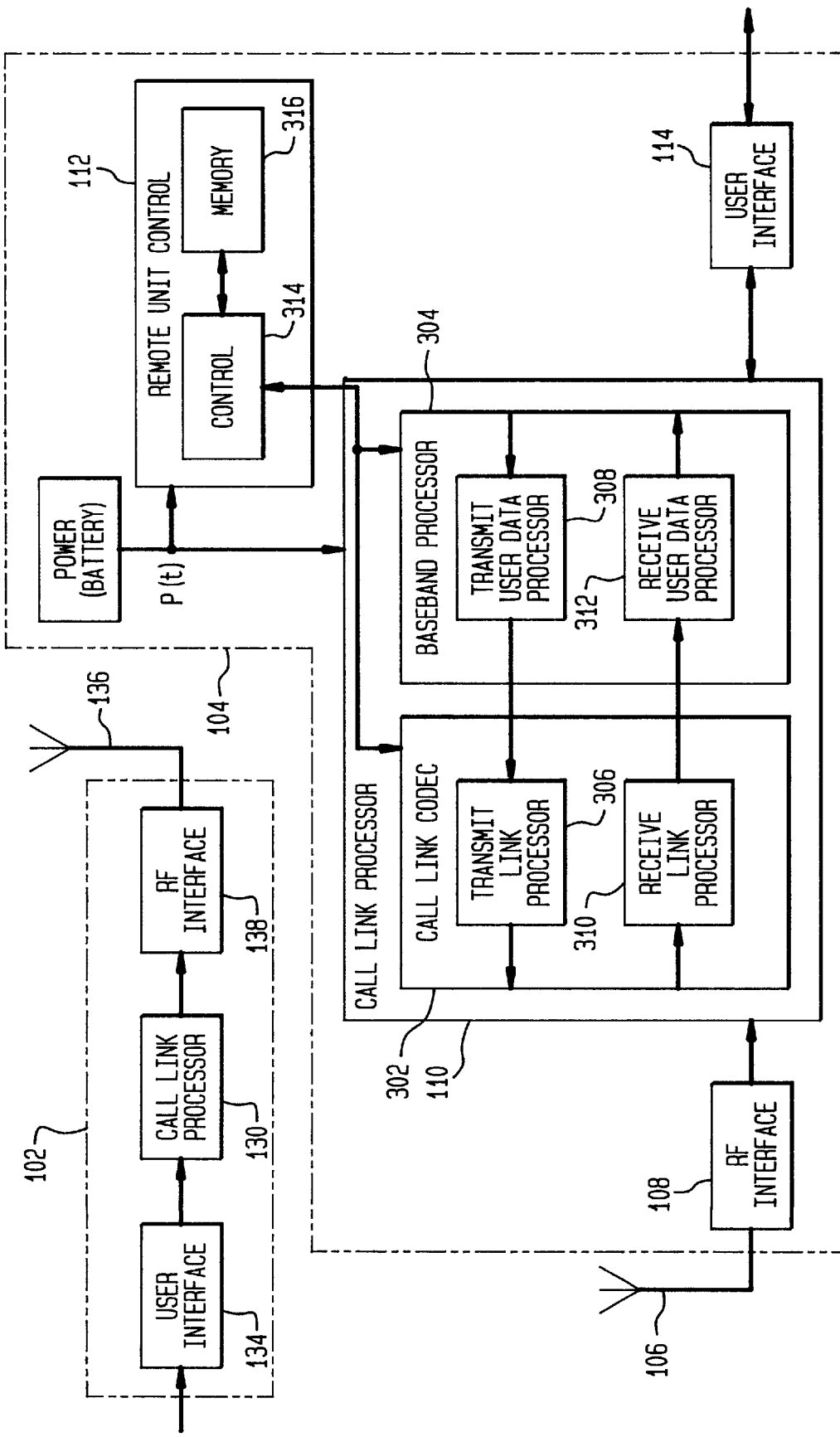
FIG. 3 is a block diagram of a call link processor of FIG. 1 in accordance with an exemplary embodiment of the present invention.

As is known in the art, both the base station 102 and the handset unit 104 are bi-directional communication transceivers. As shown in FIG. 3, base station 102 includes user interface 134 and call link processor 130 operating in a similar manner to those employed by handset unit 104. In a transmit direction of the base station 102, user information or signals may be received by user interface 134 and provided to call link processor 130 as data for encoding and formatting for transmission. Call link processor 130 in turn, provides the processed information as datablocks to a modulator of RF interface 138 for modulation onto a carrier and transmission by antenna 136 through the air interface to antenna 106 of handset 102. The base station 102 transmits the processed information as a datastream comprising a sequence of datablocks through the communication channel. Since errors may be introduced in the datastream by noise or distortion added in the communication channel, the call link processor 130 may apply error-correction encoding to the datablocks.

Preferred embodiments of the present invention desirably operate in systems having error-correction encoding of data including a form of systematic block code which appends error correction information to the data. Such systematic block codes may be, for example, Forward Error-Correction (FEC) codes such as Reed-Solomon, Hamming or Golay codes. As would be apparent to one skilled in the art, other error-correction encoding techniques may be used. In accordance with the present invention, error-correction encoding desirably employs a calculation of at least one parity bit that is then inserted into the data to form an "encoded payload" for transmission. For most applications, call link processor 130 continuously error-correction encodes data since the encoding process is generally not computationally intensive.

After error-correction encoding of the data, a checksum value for the encoded payload may be generated for use by a receiver to detect one or more errors in a received encoded payload. The encoded payload and checksum are then combined with a predetermined format to form the datablock.

Referring to FIG. 3, there is shown a call link processor 110 as may be employed in accordance with the present invention, which may be similar to call link processor 130 of base station 102. The processing required to detect an error, as described previously, is performed by call link processor 110 of FIG. 1. Call link processor 110 includes a call link coder/decoder (CODEC) 302 and a base band processing unit 304. Call link CODEC 302 includes both a transmit link processor 306 and a receive link processor 310. Base band processor 304 includes a transmit user data processor 308 and a receive user data processor 312. Also shown in FIG. 3 is a portion of the remote unit control 112 (FIG. 1) including a controller 314 and a memory 316. The call link processor 110 and the remote unit controller 112 are each provided a power signal, P(t), from a power unit 116. For convenience, the transmit link processor 306 of call link CODEC 302 and the transmit user data processor 308 of base band processing unit 304 are shown to illustrate that the call link processor 110 processes user data for transmission to other handset units.

The following describes processing of user information or signals by handset 104 to form datablocks for transmission as a datastream to base station 102. However, as known in the art, basestation 102 performs similar processing to form datablocks for transmission as a datastream to handset 104.

The transmit user data processor 308 receives user information or signals from user interface 114 and may digitally encode the user information or signals as data For example, the user's information may be provided as either an analog or digital signal and may be, for example, predictively encoded, such as by ADPCM encoding or by RCELP encoding. The transmit link processor 306 receives the data and formats the data into a formatted datablock. The formatted datablock may be of a packet format such as the packet 200 of FIG. 2. Whether a packet or framing format are used, for example, the transmit link processor 306 may apply error-correction encoding of the data, such as Reed-Soloman encoding described previously, which creates and inserts parity bits into the data to form an encoded payload.

The transmit link processor 306 then calculates a checksum value, which may be a cyclic redundancy checksum (CRC) checksum value, for the encoded payload. Transmit processor 306 then creates a formatted datablock from the encoded payload and checksum value, such as by forming a packet 200 (FIG. 2).

Exemplary embodiments of the present invention are normally provided within the receive link processing unit 310 of call link CODEC 302, but may also be included within receive user data processor 312 of the base band processing unit 304. Referring to FIG. 3, RF interface 108 provides a demodulated datastream of datablocks. The datastream is provided to receive link processor 310 which examines and, depending upon the transmit format used, parses the datastream into a sequence of datablocks. For example, the receive link processor 310 may reconstruct packets as shown in FIG. 2. In addition, receive link processor 310 may process the information contained in the packet 200 in the following manner. Receive link processor 310 may extract payload 208 and the checksum value 210 from the packet 200. Receive link processor 310 may then calculate a checksum value for the payload 208 and compare the checksum value of the payload 208 with the received checksum value 210. If the two values are equivalent then no error has occurred and the information within the encoded payload may be passed on to the receive user data processor 312 with error-correction information removed.

If the checksum value of the payload 208 and the received checksum value 210 do not match, then receive link processor 310 may be enabled to perform error-correction decoding of the payload 208 based on error-correction information included within the encoded payload. Since the comparison of the checksum value 210 and calculated checksum value are under control of controller 314, the controller 314 may be used to enable and disable operation of the error-correction decoding. When disabled, the error-correction portion of the receive link processor 310 does not operate, and so does not required power P(t) from the power unit 116, thereby conserving power of, for example, a battery.

Once the receive link processor 310 decodes the packet 200, the receive link processor 310 provides the data to receive user data processor 312. The receive user data processor 312, in turn, decodes the user information to a form suitable for user interface 114. For example, if the data of payload 208 is an ADPCM encoded voice signal, the receive user data processor 312 ADPCM decodes and reconstructs the voice signal. The reconstructed voice signal, which may either be an analog or a digital signal, is then provided to user interface 114.

Figure 4:
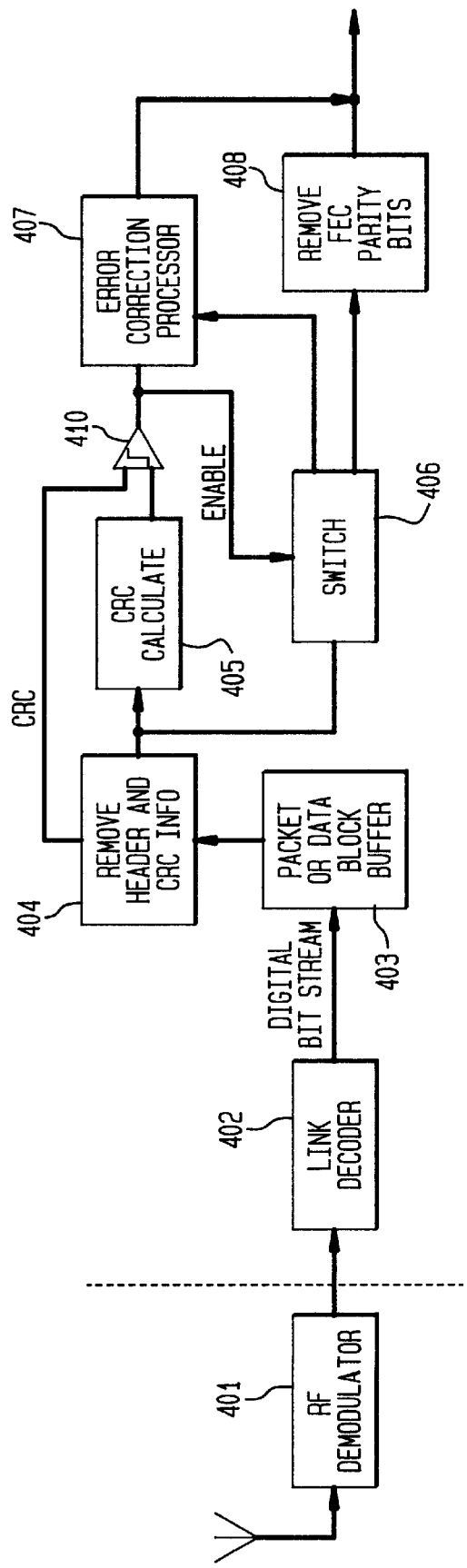
FIG. 4 is a block diagram of a receive link processor of the call link processor as shown in FIG. 3; and, FIG. 5 is a flow chart illustrating an exemplary set of steps as may be employed by an application specific processor in accordance with the present invention.

FIG. 4 illustrates a block diagram of an exemplary embodiment of receive link processor 310 of FIG. 3. As shown in FIG. 4, receive link processor 310 includes a link decoder 402, a datablock buffer 403, a header and checksum removal processor 404, a checksum calculator 405, a comparitor 410, a switch 406, an error-correction processor 407 and a parity bit removal processor 408. Also shown in FIG. 4 is the RF demodulator 401 of the RF interface 108 (FIG. 1).

Link decoder 402 receives the demodulated datastream from RF demodulator 401 and reconstructs the sequence of datablocks according to the format of, for example, packet 200. The sequence of datablocks is provided to the datablock buffer 403 for storage as individual datablocks. Each datablock of datablock buffer 403 is then provided to the header and checksum removal processor 404 for extraction of the checksum valve. Header and checksum removal processor 404 may remove header information and may examine the header information to determine 1) whether the datablock should be processed, and 2) what type of error-correction encoding may be employed of the datablock stored in the datablock buffer 403. The header checksum removal processor 404 then provides the encoded payload of the datablock to the checksum calculator 405. Checksum calculator 405 calculates a checksum of the encoded payload. The checksum value removed from the datablock and the calculated checksum of the encoded payload are compared in comparator 410.

Comparator 410 then provides an enable signal based upon the comparison between the calculated and the removed checksum value. If the enable signal indicates that the checksum value and the calculated checksum value of the encoded payload are equivalent then the enable signal disables the error-correction processor 407 and causes switch 406 to provide the encoded payload received from the header and checksum removal processor 404 to the parity bit removal processor 408. The parity bit removal processor 408 removes the parity bits used from the error-correction process from the encoded payload and provides the remaining bits of the encoded payload as the error-corrected data.

If, on the other hand, the enable signal of checksum calculator 405 indicates that the checksum value of the datablock does not equal the calculated checksum value of the encoded payload then the enable signal enables the error-correction processor 407 and causes switch 406 to provide the encoded payload of the datablock to the error-correction processor 407. Error-correction processor 407 then examines the parity bits included in the encoded payload and may correct any errors, if possible, in the encoded payload. Once the error-correction processor has corrected bit values of the encoded payload values, the error-corrected encoded payload is then provided as the error-corrected data. Not every payload may be error-corrected. For example, if multiple bit errors of encoded payload occur, then error-correction processor 407 may only "flag" the word as bad data.

Figure 5:
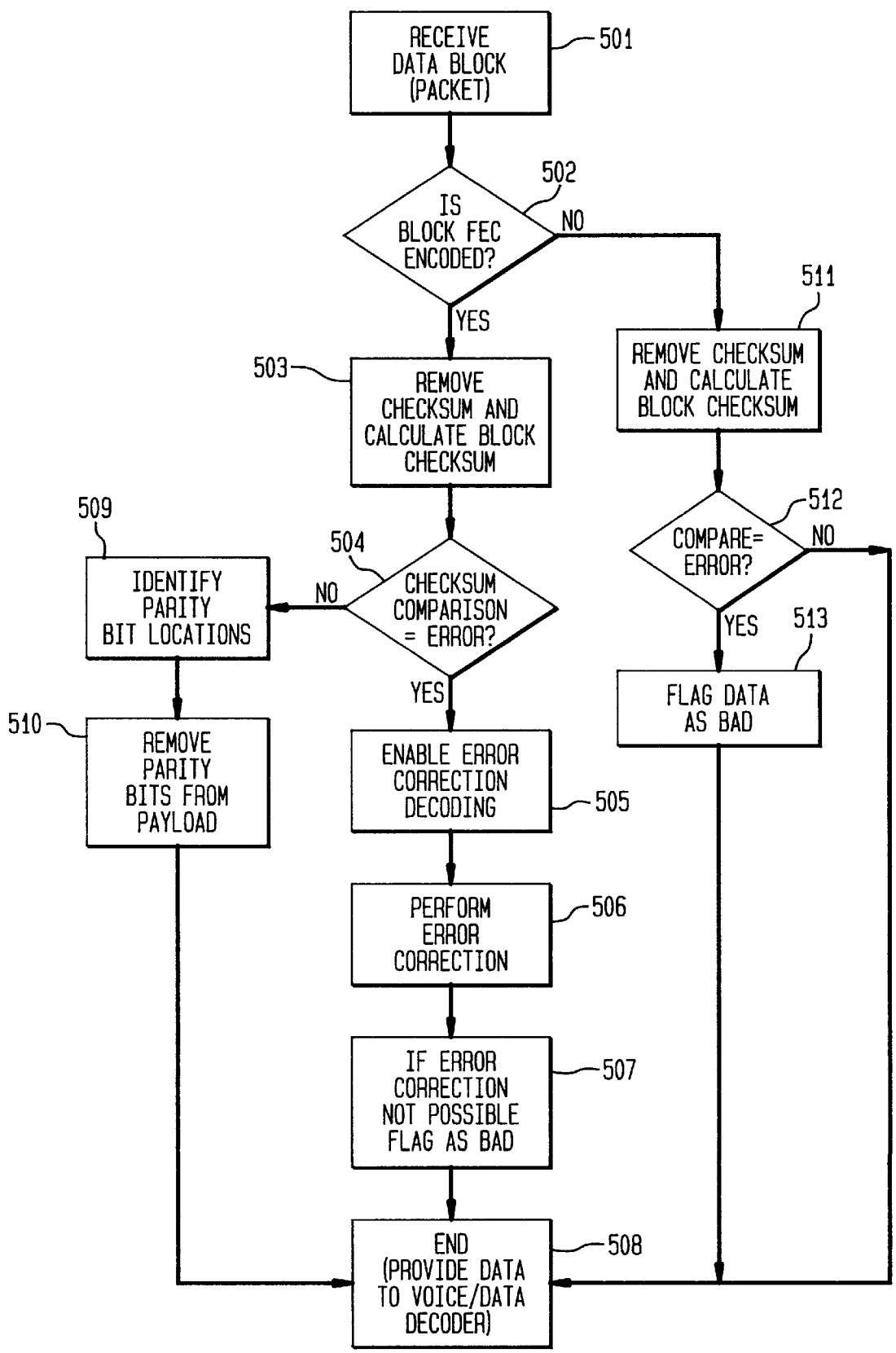

As is known in the art, call link CODEC 302 and baseband processor 304 of FIG. 3, and so the functions of the exemplary embodiment of the present invention shown in FIG. 4 may be implemented in an application-specific computer processor, such as a digital signal processor. Since disabling of the error-correction function of the processor reduces computational steps in decoding, a similar reduction in power consumption of the processor may be achieved, thereby conserving battery power. FIG. 5 is a flow chart of a program providing error-correction decoding in accordance with the present invention which may be employed by, for example, a digital signal processing device.

At step 501, a processor receives a datablock and at step 502 determines whether or not the datablock includes an error-correction encoded payload. If at step 502 the datablock is determined not to be error-correction encoded, then at step 511 a checksum from the datablock is removed and a checksum is calculated for the encoded payload. The calculated checksum and received checksum are compared at step 512 to determine if an error has occurred. If step 512 determines that the encoded payload is valid, then the data of the encoded payload is then provided to the user interface at step 508, otherwise the datablock is "flagged" as bad or dropped at step 513.

If at step 502 the datablock is determined to be error-correction encoded, then at step 503 the checksum value is removed from the encoded payload and a checksum value is calculated for the remainder of the encoded payload at step 503. At step 504 a comparison is made between the checksum value of the encoded payload and the checksum value as calculated by step 503. If in step 504 the calculated checksum and the checksum value of the datablock indicate that no error has occurred, then at step 509 the error encoding parity bit locations are identified in the encoded payload. Next, at step 510, the error encoding parity bits are removed from the encoded payload and provided to the end user at step 508.

If, at step 504 the checksum comparison indicates that an error has occurred, however, then at step 505 the error-correction processor is enabled so as to error-correct decoding of the datablock. Next at 506 the error-correction is performed for the datablock and then at step 508 the data of the encoded payload is provided to the user. In an alternative embodiment, if the error-correction process of step 506 determines that an error cannot be corrected, then the data is corrected to the best of the ability of the error-correction processor and then flagged as bad data at step 507.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. An apparatus for error-correcting data of a datablock comprising:
   a storage unit adapted to store the datablock comprising a first checksum value and an encoded payload, the encoded payload having at least one parity value;
   a calculator adapted to calculate a second checksum value for the encoded payload;
   a comparator comparing the first and second checksum values to generate a signal indicating whether the first and second checksum values are substantially equivalent;
   a bit-removal module enabled, when the signal indicates that the first and second checksum values are substantially equivalent, to i) remove the at least one parity value and ii) provide the encoded payload without the at least one parity value as error-corrected data; and
   an error-correction module enabled, when the signal indicates that the first and second checksum values are not equivalent, to error-correct the encoded payload in accordance with the at least one parity value to provide the error-corrected data.

2. The invention as recited in claim 1, wherein the encoded payload is error-correction encoded in accordance with a systematic block code.

3. The invention as recited in claim 2, wherein the systematic block code is either a Reed-Solomon code, a Hamming code, or a Golay code.

4. The invention as recited in claim 1, wherein the datablock is formatted in accordance with a transmission format having at least the first checksum value, the data, and the at least one parity value, wherein the transmission format is either a packet format having a header or a frame format having a framing value.

5. The invention as recited in claim 1, wherein the apparatus is included within a telecommunication receiver of a wireless network.

6. The invention as recited in claim 1, wherein the apparatus is included in an integrated circuit digital signal processor.

7. An integrated circuit having a processor for error-correcting data of a datablock comprising:
   a storage unit adapted to store the datablock comprising a first checksum value and an encoded payload, the encoded payload having at least one parity value;
   a calculator adapted to calculate a second checksum value for the encoded payload;
   a comparator comparing the first and second checksum values to generate a signal indicating whether the first and second checksum values are substantially equivalent;
   a bit-removal module enabled, when the signal indicates that the first and second checksum values are equivalent, to i) remove the at least one parity value and ii) provide the encoded payload without the at least one parity value as error-corrected data; and:
   an error-correction module enabled, when the signal indicates that the first and second checksum values are not equivalent, to error-correct the encoded payload in accordance with the at least one parity value to provide the error-corrected data,
   wherein the encoded payload is error-correction encoded in accordance with a systematic block code and the datablock is formatted in accordance with a transmission format having at least the first checksum value, the data, and the at least one parity value, wherein the transmission format is either a packet format having a header or a frame format having a framing value.

8. A method of error-correcting data of a datablock comprising the steps of:
   a) receiving the datablock comprising a first checksum value and an encoded payload, the encoded payload having at least one parity value;
   b) calculating a second checksum value for the encoded payload;
   c) comparing the first checksum value with the second checksum value; and
   d) if the first checksum value is substantially equivalent to the second checksum value, then:
      d1) enabling bit-removal to remove the at least one parity value, and
      d2) providing the encoded payload having the at least one parity value removed as an error-corrected data,
   otherwise, if the first checksum value is not equivalent to the second checksum value, then:
      d3) enabling error-correction of the encoded payload in accordance with the at least one parity value to provide the error-corrected data if the first checksum value is not equivalent to the second checksum value.

9. The invention as recited in claim 8, wherein the encoded payload is error-correction encoded in accordance with a systematic block code.

10. The method as recited in claim 9, wherein the systematic block code is either a Reed-Solomon code, a Hamming code, or a Golay code.

11. The invention as recited in claim 8, wherein the datablock is formatted in accordance with a transmission format having at least the first checksum value, the data, and the at least one parity bit value, and the transmission format being either a packet format including a header or a frame format having a framing value.

12. An apparatus for error-correcting data of a datablock comprising:
   storage means for storing the datablock comprising a first checksum value and an encoded payload, the encoded payload having at least one parity value;

calculating means for calculating a second checksum value for the encoded payload;

comparing means for comparing the first and second checksum values to generate a signal indicating whether the first and second checksum values are substantially equivalent;

bit-removal means, enabled when the signal indicates that the first and second checksum values are substantially equivalent, for i) removing the at least one parity value and ii) providing the encoded payload without the at least one parity value as an error-corrected data; and:

error-correction means, enabled when the signal indicates that the first and second checksum values are not equivalent, for error-correcting the encoded payload in accordance with the at least one parity value to provide the error-corrected data, the error-correction means enabled.

13. A wireless telecommunications receiver having a processor for error-correcting data of a datablock comprising:

a storage unit adapted to store the datablock comprising a first checksum value and an encoded payload, the encoded payload having at least one parity value;

a calculator adapted to calculate a second checksum value for the encoded payload;

a bit-removal module enabled, when the signal indicates that the first and second checksum values are equivalent, to i) remove the at least one parity value and ii) provide the encoded payload without the at least one parity value as error-corrected data; and:

an error-correction module enabled, when the signal indicates that the first and second checksum values are not equivalent, to error-correct the encoded payload in accordance with the at least one parity value to provide the error-corrected data.

14. The invention as recited in claim 13, wherein the encoded payload is error-correction encoded in accordance with a systematic block code and the datablock is formatted in accordance with a transmission format having at least the first checksum value, the data, and the at least one parity value, and wherein the transmission format is either a packet format having a header or a frame format having a framing value.

* * * * *